(12) United States Patent
Reichel

(10) Patent No.: US 7,868,624 B2
(45) Date of Patent: Jan. 11, 2011

(54) METHOD AND SYSTEM FOR CORRECTING THE FEEDBACK FROM ELECTRICAL MEASUREMENT CONVERTERS TO A DEVICE UNDER TEST

(75) Inventor: Thomas Reichel, Baldham (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 92 days.

(21) Appl. No.: 11/815,953

(22) PCT Filed: Feb. 2, 2006

(86) PCT No.: PCT/EP2006/000923

§ 371 (c)(1),
(2), (4) Date: Aug. 9, 2007

(87) PCT Pub. No.: WO2006/084628

PCT Pub. Date: Aug. 17, 2006

(65) Prior Publication Data

US 2008/0143343 A1 Jun. 19, 2008

(30) Foreign Application Priority Data

Feb. 9, 2005 (DE) .................. 10 2005 005 887

(51) Int. Cl.
*G01R 31/00* (2006.01)
*G01R 31/02* (2006.01)
(52) U.S. Cl. .................. 324/551; 324/500; 324/537
(58) Field of Classification Search .................. 324/500, 324/537, 551, 713
See application file for complete search history.

(56) References Cited

U.S. PATENT DOCUMENTS

| 4,871,964 | A | * | 10/1989 | Boll et al. .................. 324/754 |
| 4,890,062 | A | | 12/1989 | Haragashira |
| 5,376,902 | A | * | 12/1994 | Bockelman et al. ............ 333/5 |
| 5,502,391 | A | * | 3/1996 | Sciacero et al. ............. 324/628 |
| 5,734,268 | A | | 3/1998 | Bockelman |
| 2001/0009374 | A1 | * | 7/2001 | Yagi ........................... 324/713 |

FOREIGN PATENT DOCUMENTS

| DE | 2044500 | | 8/1971 |
| DE | 3325701 | A1 | 1/1985 |
| DE | 3903719 | A1 | 8/1989 |
| DE | 3911254 | A1 | 10/1990 |
| EP | 0 333 521 | A1 | 9/1989 |
| EP | 0 381 398 | | 8/1990 |
| EP | 1 542 026 | A1 | 6/2005 |
| EP | 1 569 005 | A | 8/2005 |
| WO | WO 2004/100513 | A1 | 11/2004 |

OTHER PUBLICATIONS

International Preliminary Report on Patentability (IPRP) for PCT/EP2006/000923.
WO PCT/EP2006/000923, International Search Report, Apr. 21, 2006.

* cited by examiner

*Primary Examiner*—Timothy J Dole
*Assistant Examiner*—Farhana Hoque
(74) *Attorney, Agent, or Firm*—Ditthavong Mori & Steiner, P.C.

(57) ABSTRACT

An approach is provided for correcting the feedback from electrical measurement converters to the device under test in the case of measurements in the high-frequency and/or microwave range. At least three measurements are implemented with respectively different input impedances of the measurement converter, and that the feedback-free measured value is then calculated from these.

11 Claims, 3 Drawing Sheets

METHOD AND SYSTEM FOR CORRECTING THE FEEDBACK FROM ELECTRICAL MEASUREMENT CONVERTERS TO A DEVICE UNDER TEST

FIELD OF THE INVENTION

The invention, according to various embodiments, relates to a method and an arrangement for correcting the feedback from electrical measurement converters to the device under test in measurements in the high-frequency and microwave range and also to an arrangement for implementing this method and to an appropriate measurement converter.

BACKGROUND OF THE INVENTION

Measurement technology is constantly faced with the problem that measurements cause feedback to the device under test. As a result, measuring instruments are designed to keep this feedback as small as possible: voltage meters have a high input impedance; power meters have an impedance value which is, if possible, as large as the rated impedance of the reference system (for example 50Ω). While it has been possible for a long time to come very close to the ideally-required impedance value in the low-frequency range, that is to say, to operate almost without feedback, this is possible only to a limited extent in the high-frequency and microwave range. For example, the design-determined parasitic input capacities of oscilloscope probe heads have the effect that the impedance value in the GHz range falls below the 1 kΩ-level. For example, in the case of microwave power sensors, it is the mechanical tolerance of the connecting jacks, which set a lower limit for the attainable matching.

Power sensors (or more accurately, terminal power sensors) are used to measure the rated power of a source, that is to say, the power, which the source can emit with surge-impedance-corrected matching.

Accordingly, power sensors are designed in such a manner that their input impedance deviates as little as possible from the reference surge impedance (generally 50Ω), and that they display the power supplied. However, since a certain mismatching of the power sensor cannot be avoided, this can impair the accuracy of power measurements.

On the one hand, mismatching on the part of the sensor means that some of the power supplied to it is emitted again in the form of a reflected wave. In the case of a thermal sensor, for example, this would have the effect that the net heat convertible into power is less than the power supplied to the sensor. In order to correct this effect, power sensors are already adjusted (calibrated) in such a manner that they display the power of the incident wave independently of the level of power actually supplied to the measurement converter. Expressed in simpler terms, a frequency-dependent sensitivity $S$ is determined, which links the raw measured value (e.g. the output value $X$ of a thermoelectric measuring cell) and the power of the incident wave:

$$S = \frac{X}{|a_i|^2} \tag{1}$$

$a_i$ incident wave $|a_i|^2$ power of the incident wave $S$ sensitivity $X$ raw measured value Given an accurate calibration process, it can therefore be assumed that the effect of the mismatching on the sensor itself can be corrected, that is to say, the power of the incident wave can be measured with a low uncertainty.

However, a second effect linked to the mismatching of the power sensor cannot be so easily reversed. The wave reflected back to the source can be reflected there again and can be superimposed on the wave incident on the power sensor, so that the power of the source changes, and the source no longer emits its rated power (feedback of the sensor to the device under test). The level of the deviation is determined by the value and phase of the reflection coefficient of the sensor and the source. The context is described by the following mathematical relationships:

$$|a_i|^2 = \frac{P_{GZ0}}{|1 - \Gamma_G \Gamma_S|^2} \tag{2}$$

$$P_{GZ0} = \frac{X}{S} \cdot |1 - \Gamma_G \Gamma_S|^2 \tag{3}$$

$P_{GZ0}$ rated power of the source (with matching)

$\Gamma_G$ complex reflection coefficient of the source $\Gamma_S$ complex reflection coefficient of the power sensor The measurement deviations caused by the feedback are generally negligible at low frequencies, where small reflection coefficients can easily be realised. However, in the microwave range, measurement deviations can occur, which exceed the specified uncertainty of the sensor for the incident wave several times over. For example, with a sensor with a reflection coefficient of 0.13 (specification for R&S NRP-Z55 at 40 GHz) and a source with a reflection coefficient of 0.33 (SWR 2.0), a measurement deviation within the range from −8.9% . . . +9.3% can occur. This is significantly more than the measurement uncertainty specified for this sensor (for the incident wave) at the level of approximately 2.5%.

Two methods are known for reducing the influence of feedback.

1. The resulting measurement deviation is reversed retrospectively using equation (3). This presupposes that the complex reflection coefficients of the source and the power sensor are known with reference to value and phase (real and imaginary component). For the power sensor, this requirement is easy to fulfil, because the reflection coefficient must be measured anyway within the framework of the production process and must also often be documented. For example, hitherto, the applicant has stored the complex reflection coefficients for the sensors in the NRP range of power meters in the data memory of the sensor and can therefore offer the correction option explained above. For this purpose, however, the reflection coefficient of the source must be entered, that is to say, it must have been measured previously. This is the actual problem of this method. Apart from the fact that it may be troublesome to measure this parameter, if no network analyser is available or if no time is available for a measurement of this kind, this measurement cannot readily be implemented at all using standard testing methods, because the reflection coefficient of a source is involved. There are, in fact, also methods available for this purpose, but it cannot generally be assumed that these methods are known and/or that the necessary equipment is available. In summary, this correction method is only used in cases, in which the increased expenditure is really worthwhile.

2. Using a tuner connected upstream of the sensor, the reflection coefficient of the sensor is adjusted at the measurement frequency to zero, so that no measurement error can occur as a result of mismatching. In this case, a network analyser is also required, in fact, for the adjustment of the tuner. An additional difficulty with this method is that the tuner adjustment is frequency dependent, that is to say, the tuner must be readjusted each time for power measurements at different frequency points. Accordingly, a remote-controllable tuner is almost indispensable for practical implementation. This method is used in isolated cases in calibration laboratories, where the measurement accuracy attainable is comparable with that described above under 1.

SUMMARY OF THE INVENTION

In accordance with various embodiments of the present invention, a method is provided for correcting feedback from electrical measurement converters to the device under test.

Moreover, a simple arrangement and a measurement converter appropriate for the correction of feedback of this kind are provided.

Advantageous further developments, especially with regard to a power sensor and respectively an oscilloscope probe head, are specified in the dependent claims. One particularly-simple arrangement for implementing a method of this kind and for the structure of a measurement converter appropriate for this purpose is specified in claims 5 and 11.

According to certain embodiments of the invention, the feedback from an electrical measurement converter, for example, a power sensor or an oscilloscope probe head, to the device under test can be calculated in a simple manner and accordingly eliminated from the measured result. For instance, in the case of a power sensor, the rated power of the source can be measured successively with a differently-matched sensor, thereby increasing the accuracy of measurement. For this purpose, the sensor is designed in such a manner that it can be operated in at least three different configurations with different input impedances. These at least three different configurations are selected in such a manner that correspondingly-different reflection coefficients are obtained. Accordingly, the source to be measured with regard to its power reacts to these different reflection coefficients with greater or lesser changes to the outgoing wave and correspondingly-different raw measured values are obtained.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF THE PREFERRED EMBODIMENTS

Figure 1:
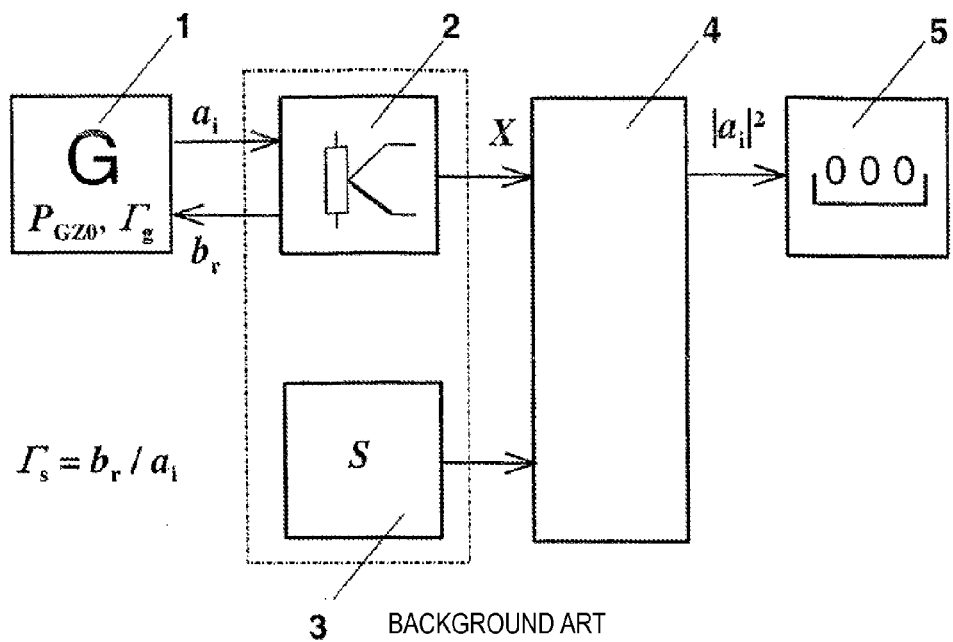
FIG. 1 shows a known arrangement for power measurement using a power sensor, according to an exemplary embodiment.

FIG. 1 shows the schematic circuit diagram of a known arrangement for rated power measurement of a high-frequency or microwave generator 1. It comprises a power detector 2, which operates, for example, according to the thermal principle, and converts the power to be measured into heat. A data memory 3, in which parameters of the detector, such as the sensitivity S are stored, is assigned to this power detector 2. The detector 2 and the data memory 3 are connected to an evaluation and control unit 4, in which the power of the incident wave of the generator 1 is calculated. This is then further processed in the display and output device 5.

Figure 2:
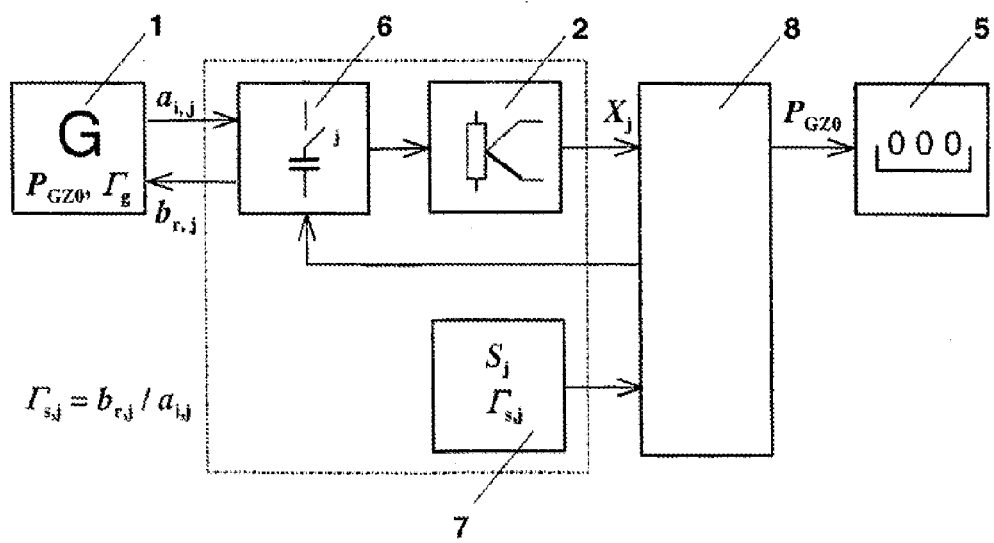
FIG. 2 shows a measurement arrangement of this kind expanded according to an exemplary embodiment.

FIG. 2 shows a measuring arrangement according to the invention, in which a component group 6 for changing the input impedance of the power detector is assigned to the power detector 2. By means of this component group 6, the sensor can be operated in at least three configurations j with different input impedances. For each configuration j, the complex reflection coefficients and the associated sensitivities, which have been determined by a preceding calibration, are stored in the data memory 7.

The evaluation is implemented with an equation system based upon equation (3) for the three unknowns $P_{GZ0}$, $\text{Re}\Gamma_G$ and $\text{Im}\Gamma_G$:

$$P_{GZ0} = \frac{X_j}{S_j} \cdot |1 - (\text{Re}\Gamma_G + j\text{Im}\Gamma_G)\Gamma_{s,j}|^2 \qquad (4)$$

Figure 3:
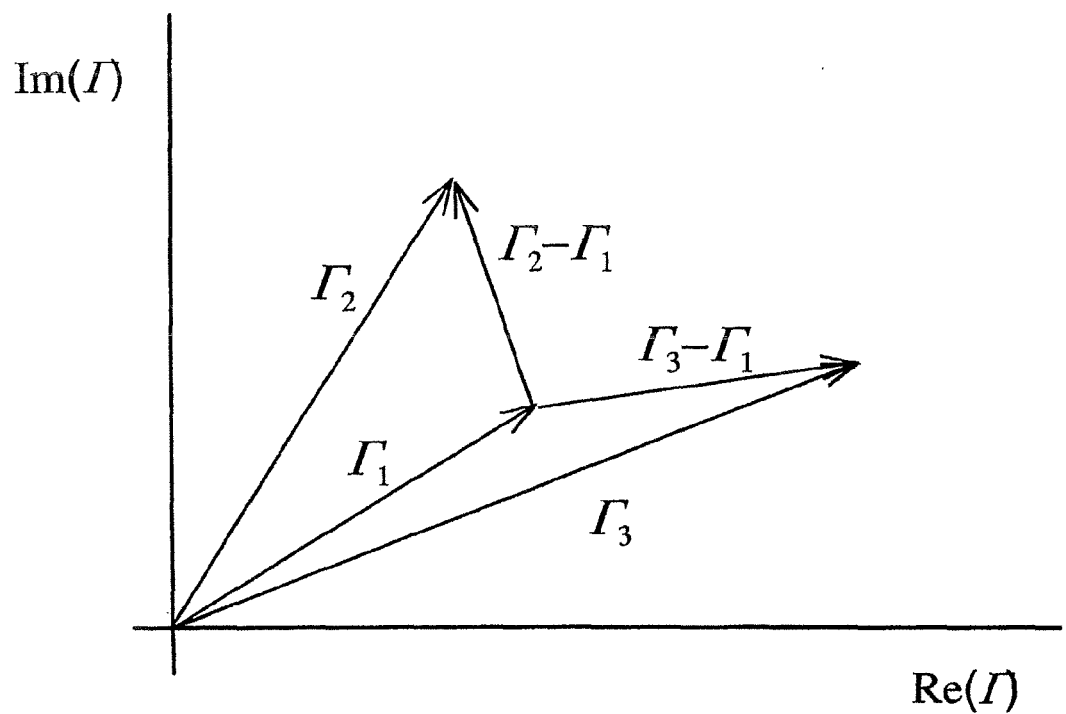
FIG. 3 shows the reflection-factor diagram obtained for a sensor of this kind with three successive measurements.

To ensure that the equation system is solvable, the raw measured values X must be present in at least three different configurations. Furthermore, the complex reflection coefficients $\Gamma_{s,j}$ and the associated sensitivities $S_j$, which can be determined by a calibration during the production process, must be known for each configuration. With four or more configurations, the equation system is over determined. The redundancy can be used to compensate measurement errors in the determination of $X_j$, $\Gamma_{s,j}$ and $S_j$. In the normal case, three or four configurations are provided. In order to achieve greater accuracy of measurement, it is advantageous if, starting from configuration 1, the reflection coefficient is changed in such a manner that two change vectors, for example, $\Gamma_{s,2} - \Gamma_{s,1}$ and $\Gamma_{s,3} - \Gamma_{s,1}$ enclose an angle from 30° to 150° —ideally 90° (see FIG. 3) and are sufficiently large so that a measurable change is obtained for the power $|a_r|^2$ of the incident wave in the event of a strong feedback. The plan and design for a component group of this kind connected upstream of the power sensor are already known to a person skilled in the art of high-frequency and microwave measurement technology.

In the evaluation and control unit 8, the required value $P_{GZ0}$ is determined from the raw measured values $X_j$ and the stored values $S_j$ and $\Gamma_{s,j}$ on the basis of equation system 4 and supplied to the output unit 5.

Figure 4:
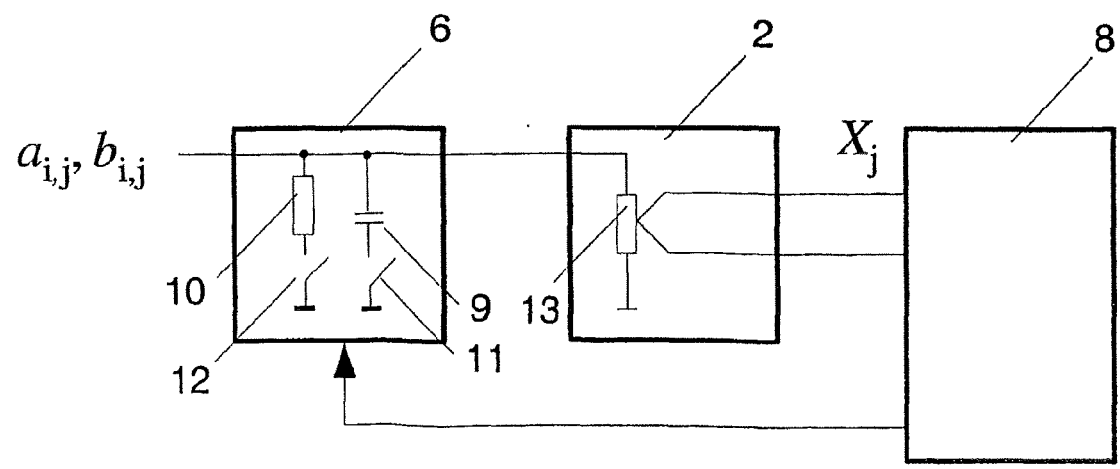
FIG. 4 shows a possible first practical solution for a power sensor according to an exemplary embodiment.

The component group 6 should be designed in such a manner that, on the one hand, the transmission behavior of the sensor does not differ substantially for the different configurations and, on the other hand, that changes in the reflection factor are caused (see above) in such a manner that an accurate determination of the rated power $P_{GZ0}$ is possible. Of the many possible realizations, FIG. 4 shows one solution, in which a capacitor 9 and/or an ohmic resistor 10 can be connected in parallel to the terminating resistor 13 of the power detector 2. Both elements are dimensioned in such a manner that the input-end reflection coefficient changes at the time of connection within the order of magnitude from 0.03 to 0.3. The 90° condition is automatically fulfilled. In total, four configurations are obtained with this arrangement, of which one is redundant:

| Configuration | Switch 12 | Switch 11 |
|---|---|---|
| 1 | Off | Off |
| 2 | Off | On |
| 3 | On | Off |
| 4 | On | On |

The measure provided according to the invention can also be used for probe heads of oscilloscopes, although the scope of the evaluation is more extensive. While, in the case of the power measurement, the shape of the curve of the signal is known (sinusoidal oscillation of a given frequency) and only its level (effective value, power) must be determined, the signals normally supplied to oscilloscopes are complex, generally non-sinusoidal signals. There is therefore a mixture of frequencies, of which the individual spectral components are attenuated or amplified and changed in their phase position differently by loading the source with the input impedance of the probe head. Accordingly, all—or at least all relevant—spectral components of the measured value and the values of the source impedance present at these frequencies must be determined.

Figure 5:
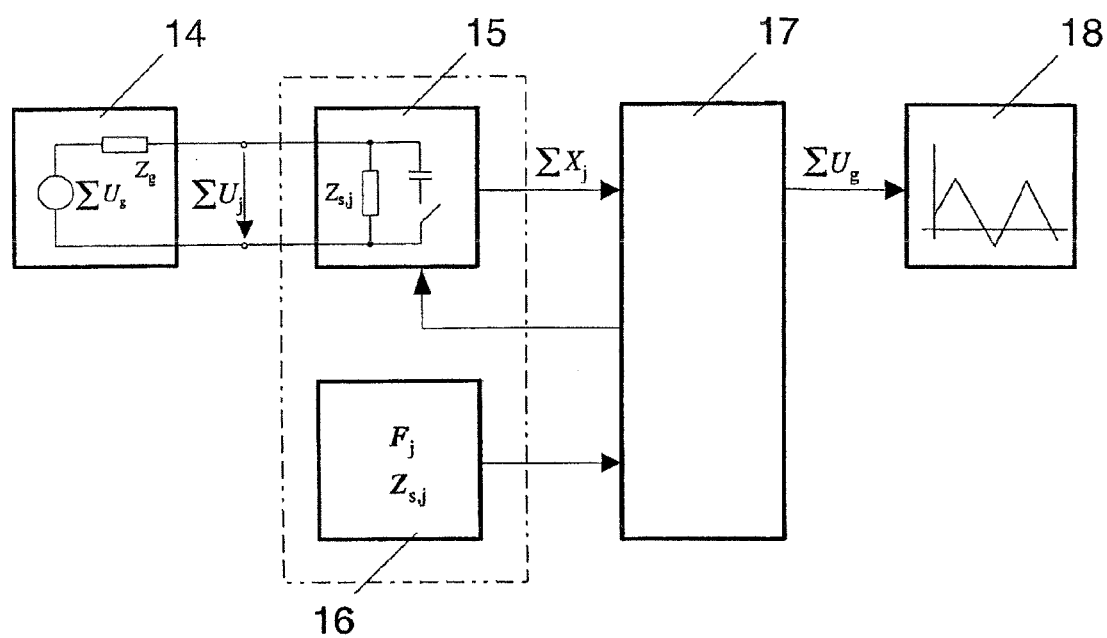
FIG. 5 shows the use of an exemplary embodiment in an oscilloscope probe head.

FIG. 5 shows a circuit according to the invention. A probe head 15, of which the input impedance can be changed in at least three stages, is connected to the output of a source 14 with the open-circuit voltage $\Sigma U_g(f)$ (sum of all spectral components) and the output impedance $Z_g(f)$. For each of these stages (j), the input impedance $Z_{s,j}(f)$ and the complex transfer constant:

$$F_j(f) = \frac{X_j(f)}{U_j(f)} \quad (5)$$

as a ratio of the output value X and the input value U, are known and stored in the memory 16. The output value X for at least three configurations is registered in the memory and evaluation unit 17 and broken down in each case into its spectral components. For a frequency f, the following applies:

$$X_j(f) = F(f) \cdot \frac{Z_{s,j}(f)}{Z_{s,j}(f) + Z_g(f)} \cdot U_g(f) \quad (6)$$

$$U_g(f) = \frac{1}{F(f)} \cdot \frac{Z_{s,j}(f) + Z_g(f)}{Z_{s,j}(f)} \cdot X_j(f) \quad (7)$$

In this case also, three unknowns—$U_g$, $Re(Z_g)$ and $Im(Z_g)$—can be calculated for each spectral component from the results of the three measurements. Once the spectral components of $U_g$ are known, the complex open-circuit voltage of the source itself can be determined by summation of the individual components and displayed in a display device 18.

By analogy with the condition that the change of the complex input-reflection factor with a power sensor according to the invention should be implemented in such a manner that the change vectors are ideally at right angles to one another, in this case, this is necessary for the change of the complex input impedance, that is to say, for $Z_{s,2}-Z_{s,1}$ and $Z_{s,3}-Z_{s,1}$.

The principle according to the invention can also be used with other types of measurement converters by providing the measurement converter with a device, which changes the feedback in a targeted manner. In this context, the number of different configurations is determined by the number of unknowns in the system of transmission equations. The problem of orthogonality described above is attributable to the requirement for a linear independent equation system. The invention is therefore not restricted to the exemplary embodiments described. All of the elements described or illustrated can be combined with one another as required.

The invention claimed is:

1. A method comprising:
    correcting feedback from electrical measurement converters to a device under test in the case of measurements in the high-frequency and/or microwave range,
    wherein
    first, the device under test is electrically connected to a switching device, and the switching device is electrically connected to a measurement converter,
    the switching device being for switching between at least three respectively different input impedances of the measurement converter,
    second, at least three measurements of the device under test are implemented with the at least three respectively different input impedances of the measurement converter, and a feedback-free measured value is then calculated from these measurements of the device under test,
    wherein the switching device for switching the input impedance of the measurement converter to at least three different input impedance values is allocated to the measurement converter.

2. A method according to claim 1,
    wherein
    four or more measurements are implemented with respectively different input impedances of the measurement converter, and that the resulting redundancy is used for the compensation of measurement errors.

3. A method according to claim 1 for correcting the feedback from a power measurement converter to the source to be measured,
    wherein
    at least three measurements are implemented with respectively different input impedances of the power measurement converter leading respectively to complex reflection coefficients, and that the rated power of the source is calculated from these at least three power measurements and from these three complex reflection coefficients together with the associated sensitivities of the power measurement converter.

4. A method according to claim 1 for correcting the feedback from an oscilloscope probe head to the device under test during the measurement of non-sinusoidal measured signals,
    wherein
    at least three measurements are implemented with respectively different input impedances of the probe head, that the open-circuit voltage of the individual spectral components of the measured signal is calculated from these at least three measurements and from the known complex transfer constant of the probe head for these three measurements, and that from these, the complex open-circuit voltage of the measured signal is finally calculated.

5. A system configured to perform a method according to claim 1, comprising the measurement converter, a data memory for the known parameters of the measurement converter, an evaluation and control device connected to the measurement converter and to this data memory, and an output and display device.

6. A system according to claim 5,
wherein
the device for switching the input impedance of the measurement converter provides different capacitors and/or ohmic resistors capable of being connected and disconnected via switches.

7. A system according to claim 5 for a power measurement converter,
wherein
for the at least three different input impedance values, the associated values for sensitivity (S) and for the respectively-associated complex reflection coefficients ($\Gamma$) of the power measurement converter are stored in the data memory.

8. A system according to claim 7,
wherein
the different input impedance values of the power measurement converter are selected in such a manner that the change vectors of the resulting different complex reflection coefficients enclose an angle between 30° and 150°.

9. A system according to claim 5 for an oscilloscope probe head,
wherein
the associated input impedance value and the complex transfer constant for the at least three different input impedance values of the probe head are stored in the data memory.

10. A system according to claim 9,
wherein
the different input impedance values of the probe head are selected in such a manner that the change vectors of the resulting different complex transfer constants enclose an angle between 30° and 150°.

11. A measurement converter configured to perform a method according to claim 1,
wherein
an associated device for switching its input impedance to at least three different input impedance values is electrically connected between the device under test and the measurement converter.

* * * * *